US 9,112,186 B2

(12) United States Patent
Lee et al.

(10) Patent No.: US 9,112,186 B2
(45) Date of Patent: Aug. 18, 2015

(54) ORGANIC LIGHT-EMITTING DIODE THREE-DIMENSIONAL IMAGE DISPLAY DEVICE

(71) Applicants: Sung-Jung Lee, Incheon (KR);
Min-Jung Kim, Incheon (KR);
Kyo-Hyeon Lee, Incheon (KR)

(72) Inventors: Sung-Jung Lee, Incheon (KR);
Min-Jung Kim, Incheon (KR);
Kyo-Hyeon Lee, Incheon (KR)

(73) Assignee: PAVONINEKOREA INC., Incheon (KR)

(*) Notice: Subject to any disclaimer, the term of this patent is extended or adjusted under 35 U.S.C. 154(b) by 93 days.

(21) Appl. No.: 14/108,194

(22) Filed: Dec. 16, 2013

(65) Prior Publication Data
US 2014/0103320 A1 Apr. 17, 2014

Related U.S. Application Data

(62) Division of application No. 13/054,592, filed on Jan. 18, 2011, now Pat. No. 8,633,477.

(30) Foreign Application Priority Data

Jul. 17, 2008 (KR) .................. 10-2008-0069669
Jul. 8, 2009 (KR) .................. 10-2009-0062302

(51) Int. Cl.
H01L 51/52 (2006.01)
G02B 27/22 (2006.01)
G02B 27/26 (2006.01)

(52) U.S. Cl.
CPC ........ *H01L 51/5293* (2013.01); *G02B 27/2214* (2013.01); *G02B 27/26* (2013.01); *H01L 51/5262* (2013.01)

(58) Field of Classification Search
CPC ............... G02B 27/2214; G02B 27/26; H01L 51/5293; H01L 51/5262
See application file for complete search history.

(56) References Cited

U.S. PATENT DOCUMENTS

| 5,822,117 | A * | 10/1998 | Kleinberger et al. | ......... 359/465 |
| 6,437,915 | B2 * | 8/2002 | Moseley et al. | .............. 359/465 |
| 2001/0013971 | A1 * | 8/2001 | Kleinberger et al. | ......... 359/465 |
| 2005/0258771 | A1 * | 11/2005 | Kang et al. | ................. 315/169.1 |
| 2005/0286126 | A1 * | 12/2005 | Huang et al. | .................. 359/465 |
| 2007/0097024 | A1 * | 5/2007 | Jung et al. | ......................... 345/32 |
| 2008/0007566 | A1 * | 1/2008 | Park et al. | ..................... 345/606 |
| 2008/0165296 | A1 * | 7/2008 | Kim et al. | ....................... 349/15 |
| 2011/0121327 | A1 * | 5/2011 | Lee et al. | ......................... 257/88 |
| 2011/0149018 | A1 * | 6/2011 | Kroll et al. | ...................... 348/40 |

* cited by examiner

*Primary Examiner* — Hrayr A Sayadian
(74) *Attorney, Agent, or Firm* — IPLA P.A.; James E. Bame

(57) ABSTRACT

An organic light-emitting diode three-dimensional image display device comprises a first substrate, a cathode formed on the first substrate, an electron injection layer formed on the cathode, an electron transfer layer formed on the electron injection layer, an emission layer formed on the electron transfer layer, a hole transfer layer formed on the emission layer, a hole injection layer formed on the hole transfer layer, an anode formed on the hole injection layer, a wire grid polarizer formed on the anode and composed of a metal thin film pattern formed at a first angle and a method thin film pattern formed at a second angle perpendicular to the first angle, which are alternately arranged, and a second substrate arranged on the wire grid polarizer.

3 Claims, 6 Drawing Sheets

ORGANIC LIGHT-EMITTING DIODE THREE-DIMENSIONAL IMAGE DISPLAY DEVICE

CROSS REFERENCES

This is a divisional of application Ser. No. 13/054,592 which is now pending.

BACKGROUND OF THE INVENTION

1. Field of the Invention

The present invention relates to an organic light-emitting diode (OLED) three-dimensional (3D) image display device and, more particularly, to an OLED 3D image display device using a wire grid polarizer composed of a metal thin film pattern formed at an angle of 45° and a metal thin film pattern formed at an angle of 135° or a wire grid polarizer formed from a metal thin film pattern formed at an angle of 45° or 0° and a retarder part having a ¼ retarder and a ¾ retarder which are alternately arranged.

2. Background of the Related Art

When a person sees an object, the person feels three-dimensional effect since his or her eyes respectively see different faces of the object due to a distance of about 65 mm between the left and right eyes. This is referred to as binocular disparity according to the left and right eyes. The images respectively seen by the left and right eyes are composed by the brain and perceived as an image having three-dimensional effect. Three-dimensional images can be displayed using this principle.

In general, three-dimensional images are displayed using the binocular disparity method and autostereoscopic technique. The binocular disparity method uses a disparity image of the left and right eyes and generates great three-dimensional effect.

A conventional three-dimensional image display device was manufactured by attaching an additional panel for displaying three-dimensional images to a two-dimensional image display device, and thus productivity was reduced and production costs increased.

SUMMARY OF THE INVENTION

Accordingly, the present invention has been made in view of the above-mentioned problems occurring in the prior art, and it is a primary object of the present invention to provide an OLED 3D image display device using a wire grid polarizer composed of a metal thin film pattern formed at an angle of 45° and a metal thin film pattern formed at an angle of 135° or a wire grid polarizer formed from a metal thin film pattern formed at an angle of 45° or 0° and a retarder part having a ¼ retarder and a ¾ retarder which are alternately arranged.

To accomplish the above object of the present invention, according to the present invention, there is provided an organic light-emitting diode (OLED) three-dimensional (3D) image display device which comprises a first substrate, a cathode formed on the first substrate, an electron injection layer formed on the cathode, an electron transfer layer formed on the electron injection layer, an emission layer formed on the electron transfer layer, a hole transfer layer formed on the emission layer, a hole injection layer formed on the hole transfer layer, an anode formed on the hole injection layer, a wire grid polarizer formed on the anode and composed of a metal thin film pattern formed at a first angle and a method thin film pattern formed at a second angle perpendicular to the first angle, which are alternately arranged, and a second substrate arranged on the wire grid polarizer.

OLED 3D image display devices according to embodiments of the present invention use a wire grid polarizer composed of a metal thin film pattern formed at an angle of 45° and a metal thin film pattern formed at an angle of 135° or a wire grid polarizer formed from a metal thin film pattern formed at an angle of 45° or 0° and a retarder part having a ¼ retarder and a ¾ retarder which are alternately arranged, and thus the OLED 3D image display devices can be easily manufactured at low costs.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
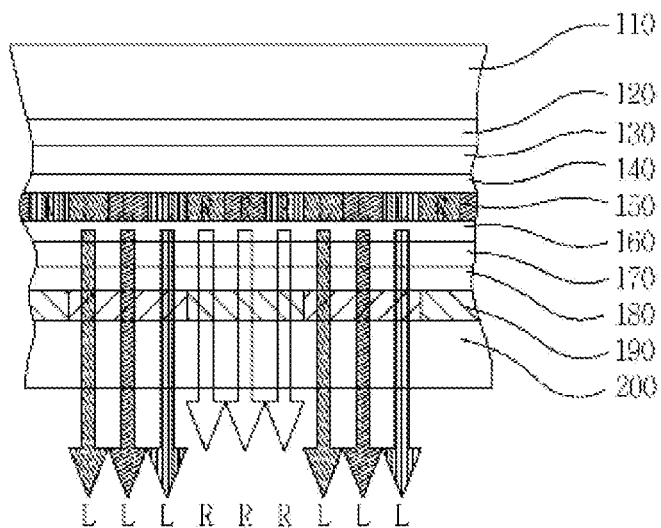
FIG. 1 is a cross-sectional view of an OLED 3D image display device according to a first embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

FIG. 1 is a cross-sectional view of an OLED 3D image display device according to a first embodiment of the present invention.

Referring to FIG. 1, the OLED 3D image display device according to the first embodiment of the present invention has a bottom emission type OLED structure and includes a first substrate 110, a cathode 120, an electron injection layer 130, an electron transfer layer 140, an emission layer 150, a hole transfer layer 160, a hole injection layer 170, an anode 180, a wire grid polarizer 190, and a second substrate 200.

The first and second substrates 110 and 200 may use an organic substrate or a transparent plastic substrate and the cathode 120 may be formed of an alloy such as aluminum-lithium or magnesium-silver on the first substrate 110. The electron injection layer 130 may be formed of trisaluminum-metalcarboxylate compound on the cathode 120 and the electron transfer layer 140 may be formed of trisaluminum on the electron injection layer 130.

The emission layer 150 may be formed of an organic material such as dephenylethenyl on the electron transfer layer 140 and emits R, G and B lights. The hole transfer layer 160 may be formed of bis-benzidine (NPB) on the emission layer 150 and the hole injection layer 170 may be formed of copper phthalocyanine (CuPC) on the hole transfer layer 160.

In addition, the anode 160 may be formed of a transparent electrode material such as indium tin oxide (ITO) on the hole injection layer 170. The wire grid polarizer 190 is composed of a metal thin film pattern formed at an angle of 45° (or 0°) and a metal thin film pattern formed at an angle of 135° (or 90°), which are alternately arranged on the anode 180. Specifically, the wire grid polarizer 190 is formed by coating a metal on the anode 180 to a thickness in the range of 100 nm to 500 nm and patterning the metal film to form the metal thin film pattern at 45° and the method thin film pattern at 135°. The second substrate 200 is arranged on the wire grid polarizer 190.

Figure 2:
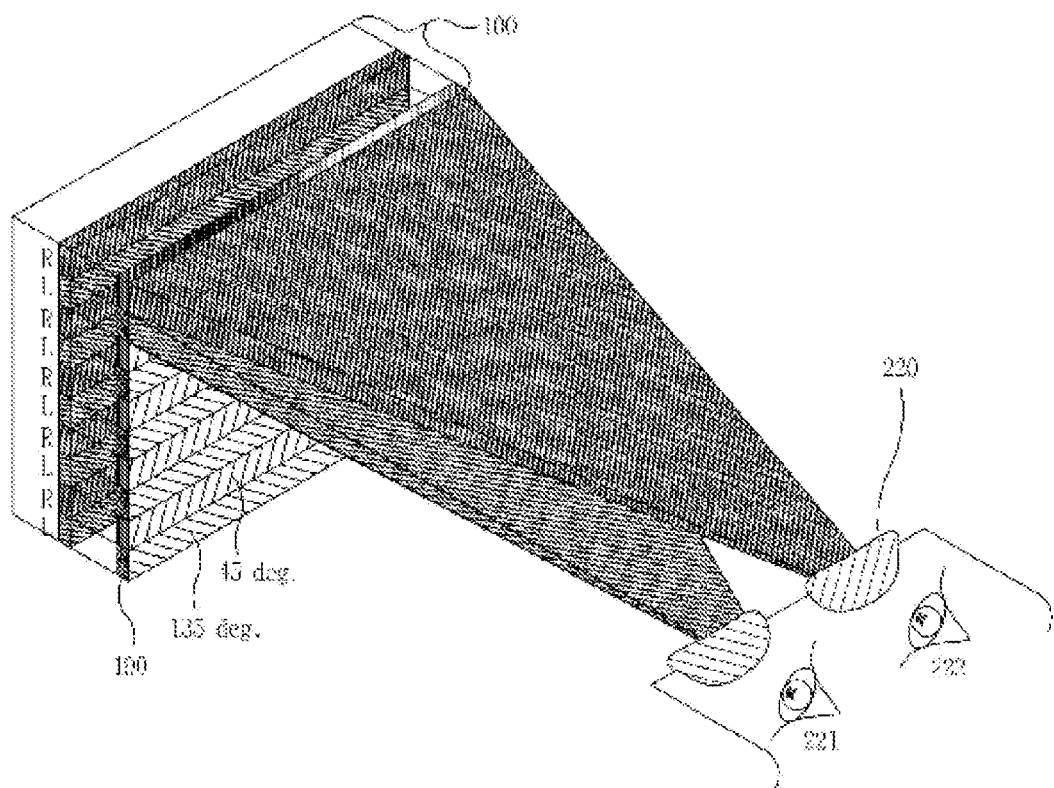
FIG. 2 is a perspective view of the OLED 3D image display device according to the first embodiment of the present invention.

Referring to FIG. 2, light emitted from portions R of the emission layer 150 passes through areas of the wire grid polarizer 190, which correspond to the metal thin film pattern formed at 45°, and linear polarizing glasses 220 to reach the right eye 222 of an observer and light emitted from portions L of the emission layer 150 passes through areas of the wire grid polarizer 190, which correspond to the metal thin film pattern formed at 135°, and the linear polarizing glasses 220 to reach the left eye 221 of the observer. The images respectively arrived at the left and right eyes of the observer are composed by the brain of the observer, and thus the observer can feel 3D effect.

Figure 3:
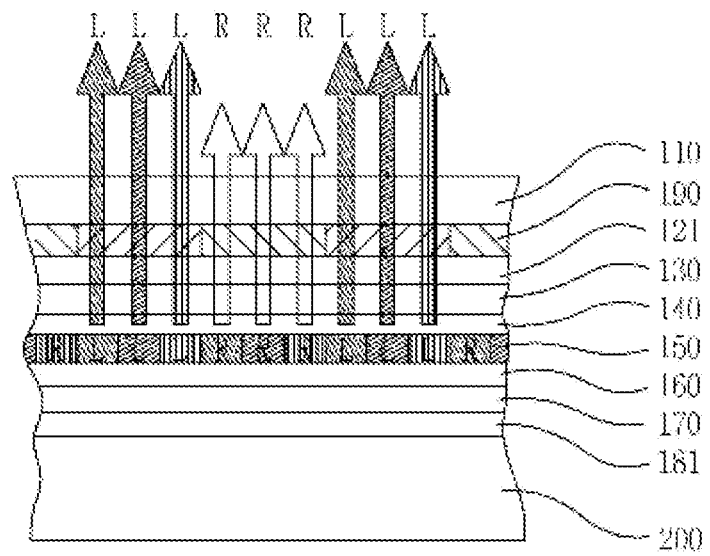
FIG. 3 is a cross-sectional view of an OLED 3D image display device according to a second embodiment of the present invention.

FIG. 3 is a cross-sectional view of an OLED 3D image display device according to a second embodiment of the present invention Referring to FIG. 3, the OLED 3D image display device according to the second embodiment of the present invention has a top emission type OLED structure and includes the first substrate 110, the wire grid polarizer 190, a transflective cathode 121, the electron injection layer 130, the electron transfer layer 140, the emission layer 150, the hole transfer layer 160, the hole injection layer 170, a reflective anode 181, and the second substrate 200. The OLED 3D image display device according to the second embodiment of the present invention is distinguished from the OLED 3D image display device according to the first embodiment of the present invention in that the wire grid polarizer 190 is arranged on the first substrate 110 and the OLED 3D image display device includes the transflective cathode 121 and the reflective anode 181.

Figure 4:
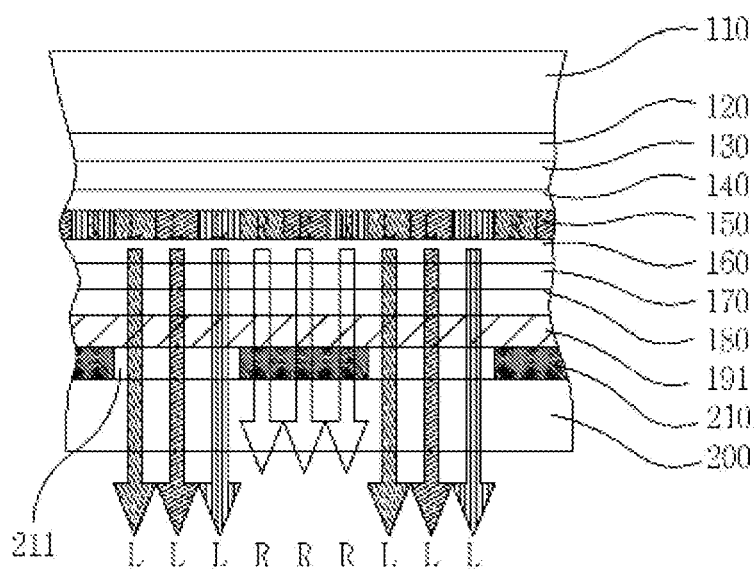
FIG. 4 is a cross-sectional view of an OLED 3D image display device according to a third embodiment of the present invention.

FIG. 4 is a cross-sectional view of an OLED 3D image display device according to a third embodiment of the present invention.

Referring to FIG. 4, the OLED 3D image display device according to the third embodiment of the present invention has a bottom emission OLED structure and includes the first substrate 110, the cathode 120, the electron injection layer 130, the electron transfer layer 140, the emission layer 150, the hole transfer layer 160, the hole injection layer 170, the anode 180, a wire grid polarizer 191, a retarder part having a ¼ retarder 210 and a ¾ retarder 211, which are alternately arranged, and the second substrate 200.

The first and second substrates 110 and 200 may use an organic substrate or a transparent plastic substrate and the cathode 120 may be formed of an alloy such as aluminum-lithium or magnesium-silver on the first substrate 110. The electron injection layer 130 may be formed of trisaluminum-metalcarboxylate compound on the cathode 120 and the electron transfer layer 140 may be formed of trisaluminum on the electron injection layer 130.

The emission layer 150 may be formed of an organic material such as dephenylethenyl on the electron transfer layer 140 and emits R, G and B lights. The hole transfer layer 160 may be formed of bis-benzidine (NPB) on the emission layer 150 and the hole injection layer 170 may be formed of copper phthalocyanine (CuPC) on the hole transfer layer 160.

In addition, the anode 160 may be formed of a transparent electrode material such as ITO on the hole injection layer 170. The wire grid polarizer 191 is formed from a metal thin film pattern formed at an angle of 45° or 0° and the retarder part having the ¼ retarder 210 and the ¾ retarder 211, which are alternately arranged, is formed on the wire grid polarizer 191. The second substrate 200 is arranged on the retarder part. Specifically, the wire grid polarizer 191 is formed in such a manner that a metal is coated on the anode 180 to a thickness in the range of 100 nm to 1500 nm and patterned to form the metal thin film pattern at 45° or 0°.

Figure 5:
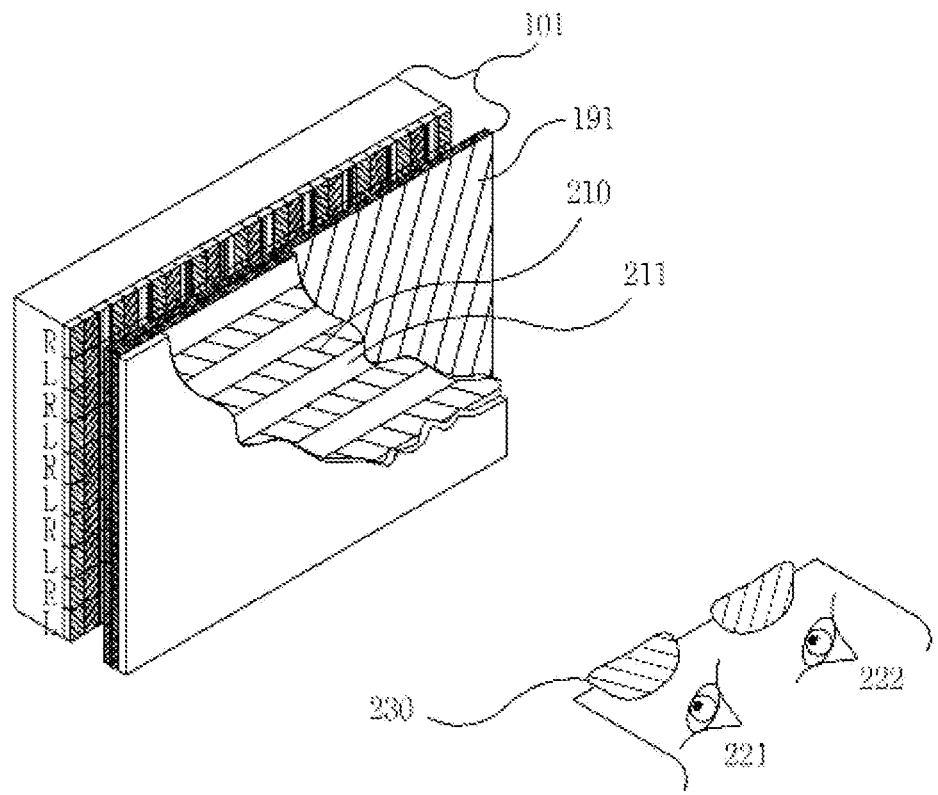
FIG. 5 a perspective view of the OLED 3D image display device according to the third embodiment of the present invention.

Referring to FIG. 5, light emitted from the portions R of the emission layer 150 passes through the wire grid polarizer 190, the ¼ retarder 210 and circular polarizing glasses 230 to reach the right eye 222 of the observer and light emitted from the portions L of the emission layer 150 passes through the wire grid polarizer 191, the ¾ retarder 211 and the circular polarizing glasses 230 to reach the left eye 221 of the observer. The two images respectively arrived at the left and right eyes of the observer are composed by the brain of the observer, and thus the observer can feel 3D effect.

Figure 6:
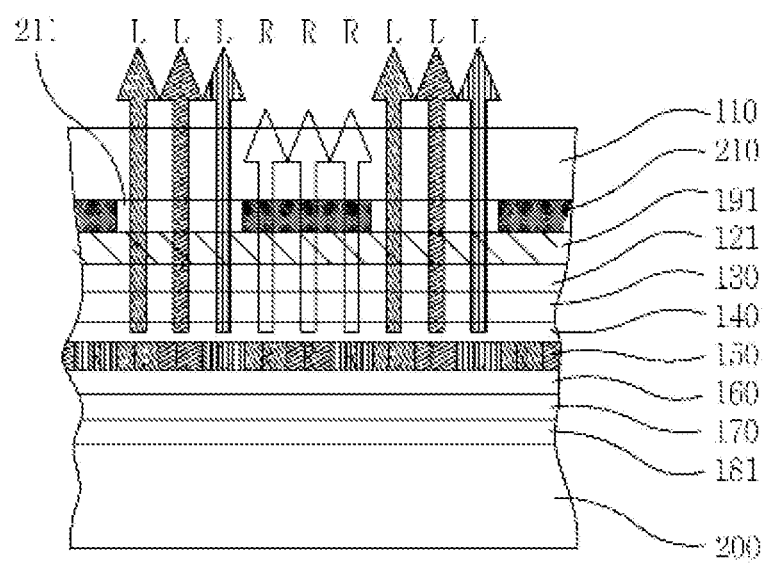
FIG. 6 is a cross-sectional view of an OLED 3D image display device according to a fourth embodiment of the present invention.

FIG. 6 is a cross-sectional view of an OLED 3D image display device according to a fourth embodiment of the present invention.

Referring to FIG. 6, the OLED 3D image display device according to the fourth embodiment of the present invention has a top emission type OLED structure and includes the first substrate 110, the retarder part having the ¼ retarder 210 and the ¾ retarder 211, which are alternately arranged, the wire grid polarizer 191, the transflective cathode 121, the electron injection layer 130, the electron transfer layer 140, the emission layer 150, the hole transfer layer 160, the hole injection layer 170, a reflective anode 181, and the second substrate 200. The OLED 3D image display device according to the fourth embodiment of the present invention is distinguished from the OLED 3D image display device according to the third embodiment of the present invention in that the retarder part is formed on the first substrate 110, the wire grid polarizer 191 is located on the retarder part, and the OLED 3D image display device includes the transflective cathode 121 and the reflective anode 181.

Figure 7:
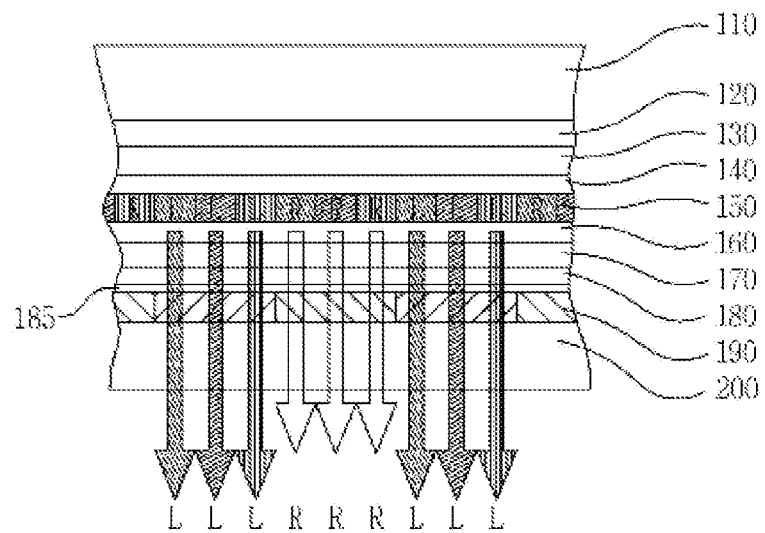
FIG. 7 is a cross-sectional view of an OLED 3D image display device according to a fifth embodiment of the present invention.

FIG. 7 is a cross-sectional view of an OLED 3D image display device according to a fifth embodiment of the present invention Referring to FIG. 7, the OLED 3D image display device according to the fifth embodiment of the present invention has a bottom emission type OLED structure and includes the first substrate 110, the cathode 120, the electron injection layer 130, the electron transfer layer 140, the emission layer 150, the hole transfer layer 160, the hole injection layer 170, the anode 180, a ¼ retarder 185, the wire grid polarizer 190, and the second substrate 200.

The first and second substrates 110 and 200 may use an organic substrate or a transparent plastic substrate and the cathode 120 may be formed of an alloy such as aluminum-lithium or magnesium-silver on the first substrate 110. The electron injection layer 130 may be formed of trisaluminum-metalcarboxylate compound on the cathode 120 and the electron transfer layer 140 may be formed of trisaluminum on the electron injection layer 130.

The emission layer 150 may be formed of an organic material such as dephenylethenyl on the electron transfer layer 140 and emits R, G and B lights. The hole transfer layer 160 may be formed of bis-benzidine (NPB) on the emission layer 150 and the hole injection layer 170 may be formed of copper phthalocyanine (CuPC) on the hole transfer layer 160.

In addition, the anode 160 may be formed of a transparent electrode material such as ITO on the hole injection layer 170. The ¼ retarder 185 may be formed on the anode 180. The wire grid polarizer 190 is composed of a metal thin film pattern formed at an angle of 45° (or 0°) and a method thin film pattern formed at an angle of 135° (or 90°), which are alternately arranged on the ¼ retarder 185. Specifically, the wire grid polarizer 190 is formed by coating a metal on the ¼ retarder 185 to a thickness in the range of 100 nm to 500 nm and patterning the metal film to form the metal thin film pattern arranged at 45° and the method thin film pattern arranged at 135°. The second substrate 200 is arranged on the wire grid polarizer 190.

Figure 8:
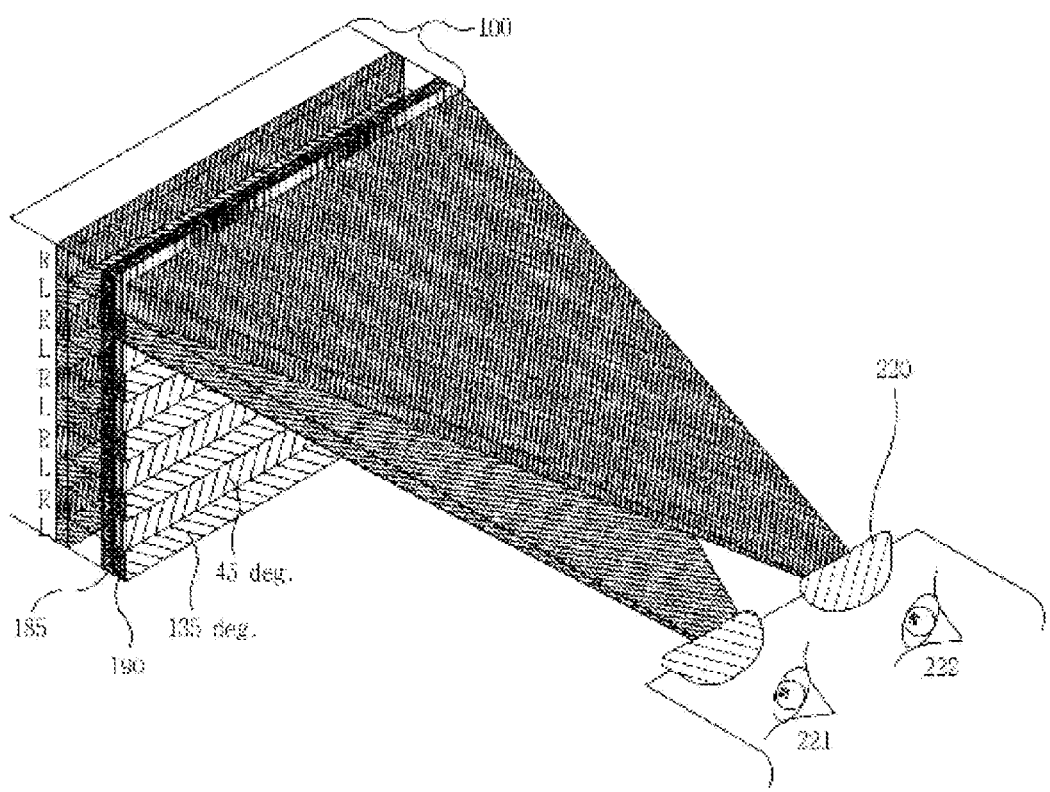
FIG. 8 is a perspective view of the OLED 3D image display device according to the fifth embodiment of the present invention.

Referring to FIG. 8, light emitted from the portions R of the emission layer 150 passes through the areas of the wire grid polarizer 190, which correspond to the metal thin film pattern arranged at 45°, and the linear polarizing glasses 220 to reach the right eye 222 of an observer and light emitted from the portions L of the emission layer 150 passes through the areas of the wire grid polarizer 190, which correspond to the metal thin film pattern arranged at 135°, and the linear polarizing glasses 220 to reach the left eye 221 of the observer. The images respectively arrived at the left and right eyes of the observer are composed by the brain of the observer, and thus the observer can feel 3D effect.

Figure 9:
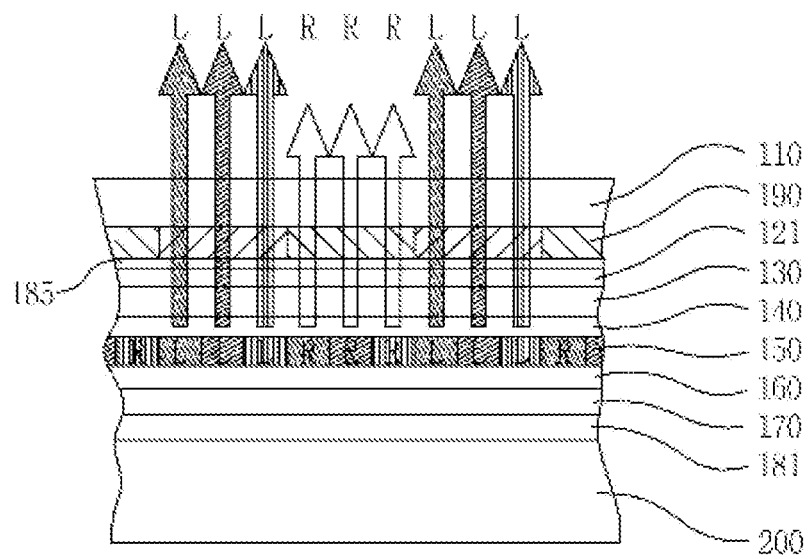
FIG. 9 is a cross-sectional view of an OLED 3D image display device according to a ninth embodiment of the present invention.

FIG. 9 is a cross-sectional view of an OLED 3D image display device according to a sixth embodiment of the present invention.

Referring to FIG. 9, the OLED 3D image display device according to the sixth embodiment of the present invention has a top emission type OLED structure and includes the first substrate 110, the wire grid polarizer 190, the transflective cathode 121, the electron injection layer 130, the electron transfer layer 140, the emission layer 150, the hole transfer layer 160, the hole injection layer 170, a reflective anode 181, the ¼ retarder 185, and the second substrate 200. The OLED 3D image display device according to the sixth embodiment of the present invention is distinguished from the OLED 3D image display device according to the fifth embodiment of the present invention in that the wire grid polarizer 190 is arranged on the first substrate 110 and the OLED 3D image display device includes the transflective cathode 121 and the reflective anode 181.

Figure 10:
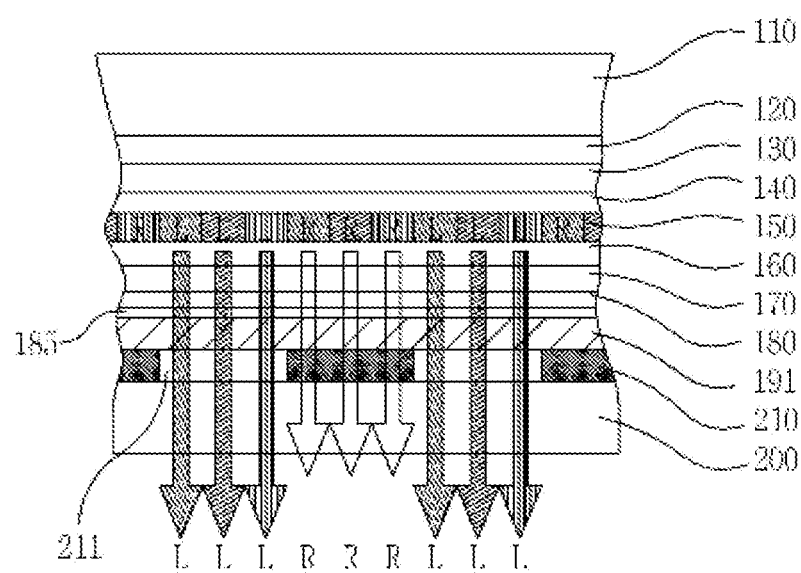
FIG. 10 is a cross-sectional view of an OLED 3D image display device according to a seventh embodiment of the present invention.
Figure 11:
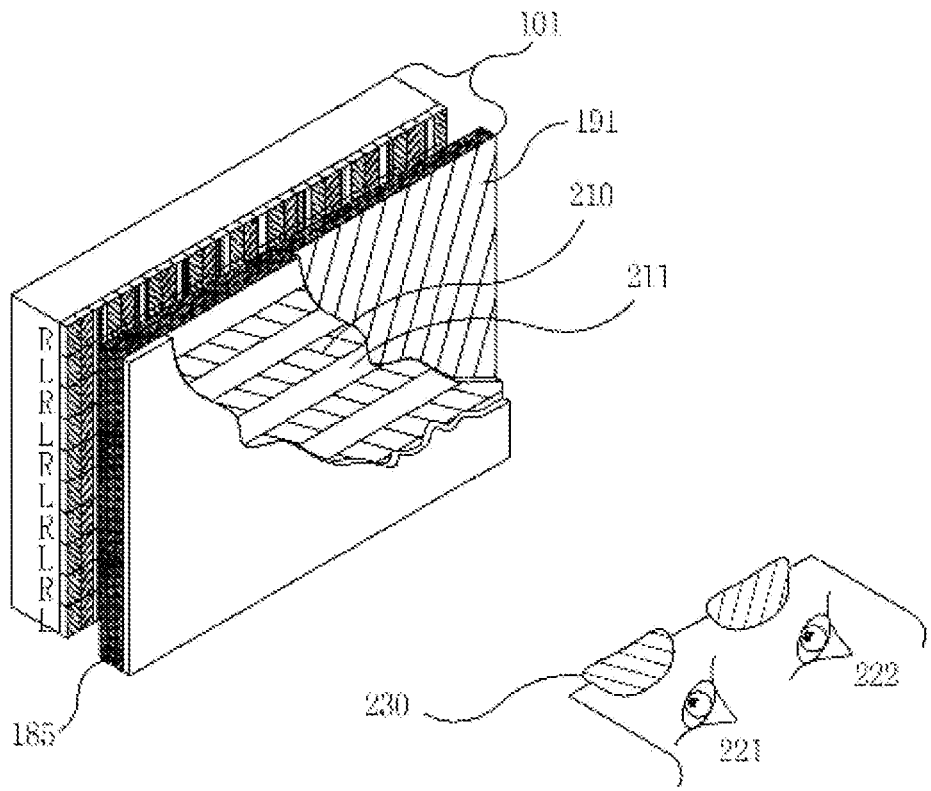
FIG. 11 is a perspective view of the OLED 3D image display device according to the seventh embodiment of the present invention.

FIG. 10 is a cross-sectional view of an OLED 3D image display device according to a seventh embodiment of the present invention.

Referring to FIG. 10, the OLED 3D image display device according to the seventh embodiment of the present invention has a bottom emission type OLED structure and includes the first substrate 110, the cathode 120, the electron injection layer 130, the electron transfer layer 140, the emission layer 150, the hole transfer layer 160, the hole injection layer 170, the anode 180, the upper ¼ retarder 185, the wire grid polarizer 191, a retarder part having the lower ¼ retarder 210 and the ¾ retarder 211, which are alternately arranged, and the second substrate 200.

The first and second substrates 110 and 200 may use an organic substrate or a transparent plastic substrate and the cathode 120 may be formed of an alloy such as aluminum-lithium or magnesium-silver on the first substrate 110. The electron injection layer 130 may be formed of trisaluminum-metalcarboxylate compound on the cathode 120 and the electron transfer layer 140 may be formed of trisaluminum on the electron injection layer 130.

The emission layer 150 may be formed of an organic material such as dephenylethenyl on the electron transfer layer 140 and emits R, G and B lights. The hole transfer layer 160 may be formed of bis-benzidine (NPB) on the emission layer 150 and the hole injection layer 170 may be formed of copper phthalocyanine (CuPC) on the hole transfer layer 160.

In addition, the anode 160 may be formed of a transparent electrode material such as ITO on the hole injection layer 170. The upper ¼ retarder 185 may be formed on the anode 180. The wire grid polarizer 191 is formed from a metal thin film pattern arranged at an angle of 45° or 0° and the upper retarder 185, and the retarder part having the lower ¼ retarder 210 and the ¾ retarder 211, which are alternately arranged, is formed on the wire grid polarizer 191. The second substrate 200 is located on the retarder part. Specifically, the wire grid polarizer 191 is formed in such a manner that a metal is coated on the anode 180 to a thickness in the range of 100 nm to 1500 nm and patterned to form the metal thin film pattern arranged at 45° or 0°.

Referring to FIG. 1, light emitted from the portions R of the emission layer 150 passes through the upper 14/retarder 185, the wire grid polarizer 191, the ¼ retarder 210 and circular polarizing glasses 230 to reach the right eye 222 of the observer and light emitted from the portions L of the emission layer 150 passes through the upper ¼ retarder 185, the wire grid polarizer 191, the ¾ retarder 211 and the circular polarizing glasses 230 to reach the left eye 221 of the observer. The images respectively arrived at the left and right eyes of the observer are composed by the brain of the observer, and thus the observer can feel 3D effect.

Figure 12:
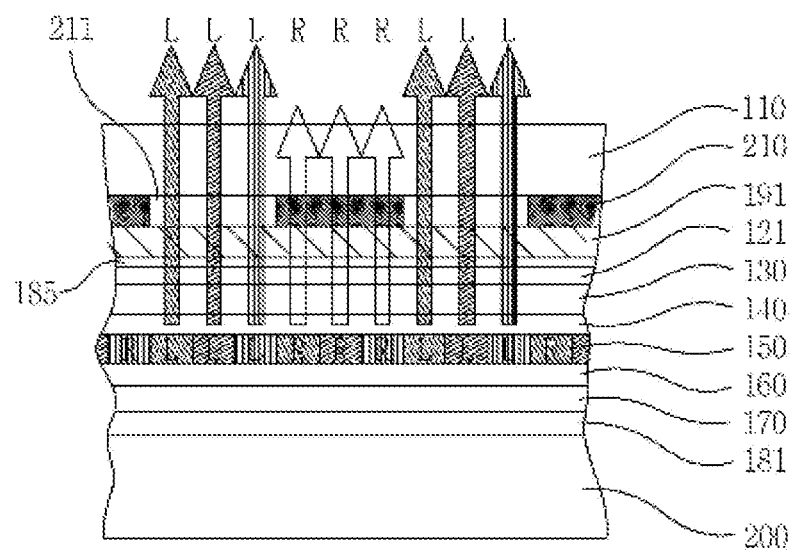
FIG. 12 is a cross-sectional view of an OLED 3D image display device according to an eighth embodiment of the present invention.

FIG. 12 is a cross-sectional view of an OLED 3D image display device according to an eighth embodiment of the present invention.

Referring to FIG. 12, the OLED 3D image display device according to the eighth embodiment of the present invention has a top emission type OLED structure and includes the first substrate 110, the retarder part having the lower ¼ retarder 210 and the ¾ retarder 211, which are alternately arranged, the wire grid polarizer 191, the transflective cathode 121, the electron injection layer 130, the electron transfer layer 140, the emission layer 150, the hole transfer layer 160, the hole injection layer 170, the reflective anode 181, and the second substrate 200.

The OLED 3D image display device according to the eighth embodiment of the present invention is distinguished from the OLED 3D image display device according to the seventh embodiment of the present invention in that the retarder part is formed on the first substrate 110, the wire grid polarizer 191 is arranged on the retarder part, and the OLED 3D image display device includes the transflective cathode 121 and the reflective anode 181.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An organic light-emitting diode (OLED) three-dimensional (3D) image display device comprising:
    a first substrate;
    a retarder part having an upper ¼ retarder and a ¾ retarder which are alternately formed on the first substrate;
    a wire grid polarizer arranged on the retarder part and formed from a metal thin film pattern formed in one direction;
    a lower ¼ retarder formed on the wire grid polarizer;
    a transflective cathode formed on the lower ¼ retarder;
    an electron injection layer formed on the transflective cathode;
    an electron transfer layer formed on the electron injection layer;
    an emission layer formed on the electron transfer layer;
    a hole transfer layer formed on the emission layer;
    a hole injection layer formed on the hole transfer layer;
    a reflective anode formed on the hole injection layer; and
    a second substrate arranged on the reflective anode.

2. The OLED 3D image display device of claim 1, wherein the wire grid polarizer is formed from a metal thin film pattern formed at an angle of 0°.

3. The OLED 3D image display device of claim 1, wherein the wire grid polarizer is formed from a metal thin film pattern formed at an angle of 45°.

* * * * *